United States Patent
Goto

(10) Patent No.: US 7,263,885 B2
(45) Date of Patent: Sep. 4, 2007

(54) PHYSICAL QUANTITY SENSOR HAVING SENSOR CHIP AND CIRCUIT CHIP

(75) Inventor: Keisuke Goto, Obu (JP)

(73) Assignee: DENSO CORPORATION, Kariya (JP)

( * ) Notice: Subject to any disclaimer, the term of this patent is extended or adjusted under 35 U.S.C. 154(b) by 177 days.

(21) Appl. No.: 11/052,090

(22) Filed: Feb. 8, 2005

(65) Prior Publication Data
US 2005/0178203 A1    Aug. 18, 2005

(30) Foreign Application Priority Data
Feb. 12, 2004    (JP)    .............................. 2004-035227

(51) Int. Cl.
*G01P 15/125*    (2006.01)
(52) U.S. Cl. ...................... 73/514.32; 73/493; 361/280
(58) Field of Classification Search ................... 73/493, 73/514.32; 361/280
See application file for complete search history.

(56) References Cited

U.S. PATENT DOCUMENTS

| | | | |
|---|---|---|---|
| 5,864,063 A * | 1/1999 | Otani et al. ............... | 73/514.32 |
| 6,151,966 A | 11/2000 | Sakai et al. | |
| 6,644,117 B1 * | 11/2003 | Kueck et al. ............ | 73/514.32 |
| 6,763,716 B2 * | 7/2004 | Nagahara et al. ............. | 73/493 |
| 6,935,176 B2 * | 8/2005 | Goto et al. ............... | 73/514.32 |

OTHER PUBLICATIONS

Examination Report from Chinese Patent Office issued on Aug. 25, 2006 for the corresponding Chinese patent application No. 200510007074.9 (a copy and English translation thereof).

* cited by examiner

Primary Examiner—John E. Chapman
(74) Attorney, Agent, or Firm—Posz Law Group, PLC

(57) ABSTRACT

A physical quantity sensor includes: a circuit chip; and a sensor chip disposed on the circuit chip through an adhesive layer. The sensor chip includes: a support substrate; a movable electrode; and a pair of fixed electrodes facing the movable electrode with a detection distance therebetween. The movable electrode and the fixed electrodes are disposed on the substrate. The adhesive layer includes a non-adhesive region and a conductive member. The non-adhesive region is disposed on a region obtained by projecting the sensor chip to the circuit chip. The conductive member is disposed in the non-adhesive region for electrically connecting between the circuit chip and the substrate.

10 Claims, 8 Drawing Sheets

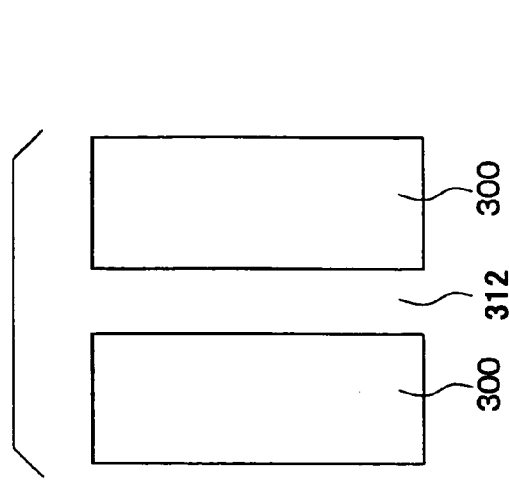
FIG. 8A
FIG. 8B
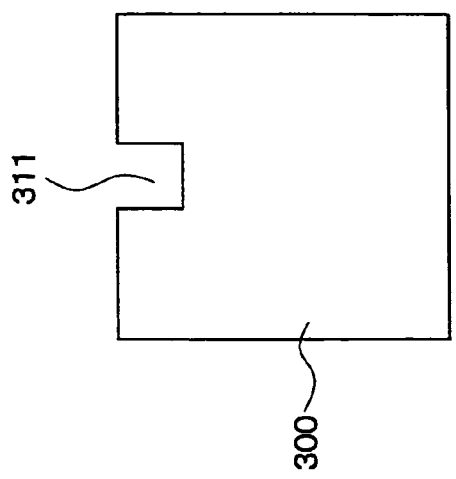
FIG. 10 RELATED ART
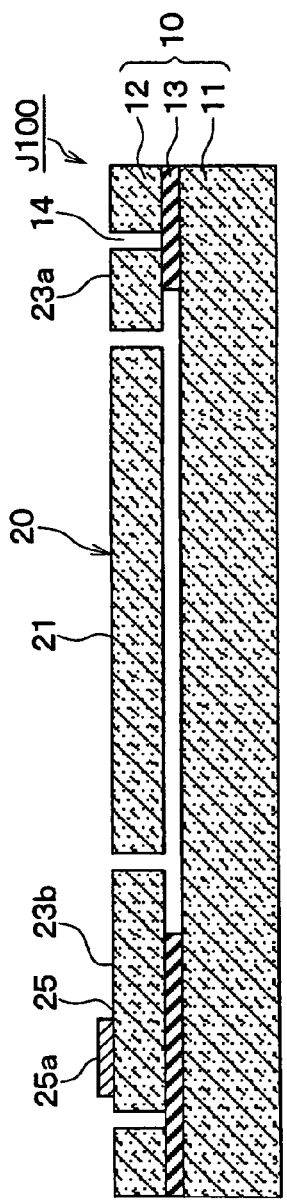

FIG. 9  RELATED ART
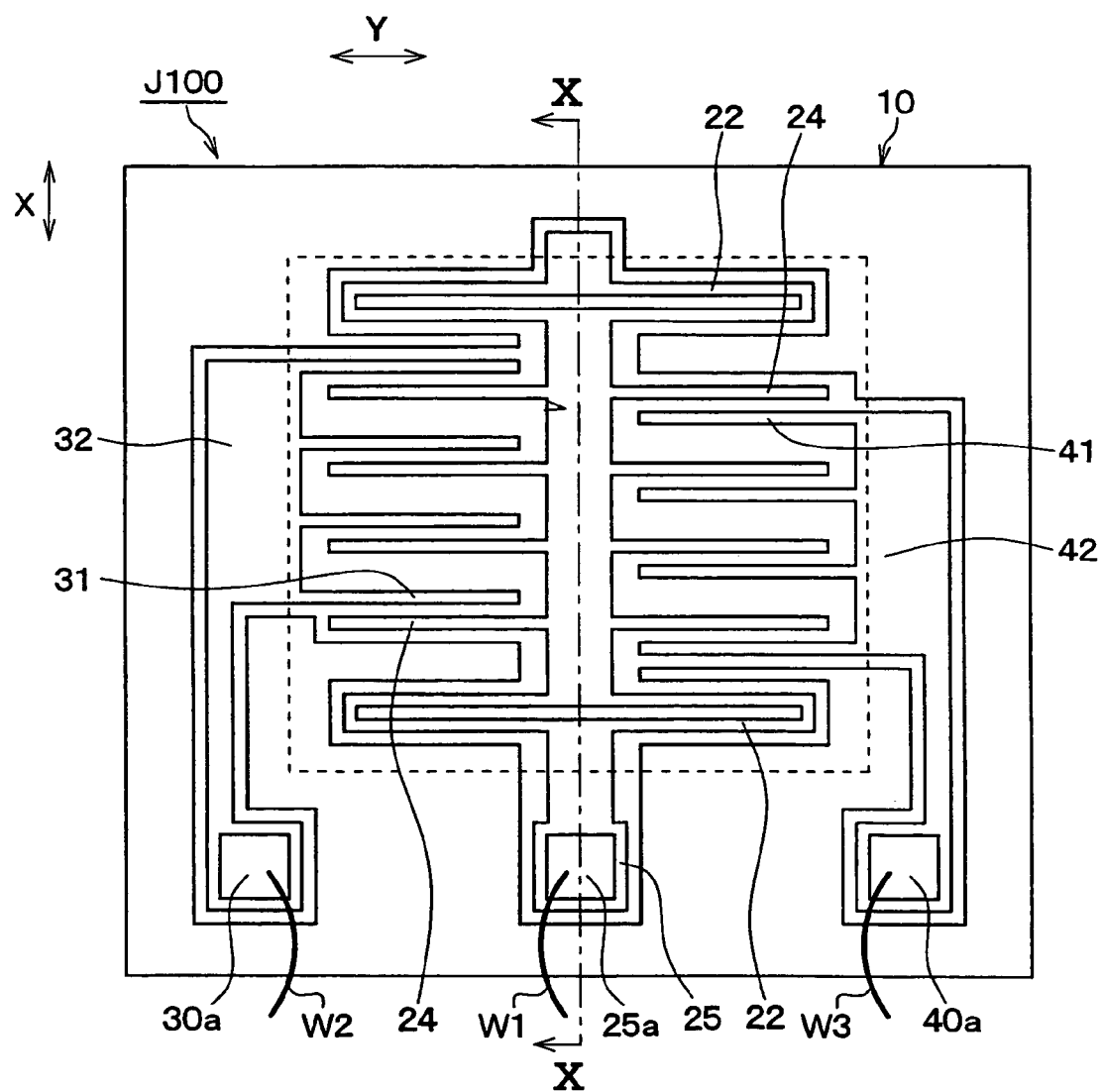

ID OF THE INVENTION

The present invention relates to a physical quantity sensor having a sensor chip and a circuit chip.

BACKGROUND OF THE INVENTION

A physical quantity sensor having a sensor chip disposed on a circuit chip is, for example, disclosed in U.S. Pat. No. 6,151,966. The sensor chip is laminated on the circuit chip through an adhesive layer. The sensor chip includes a movable electrode and a fixed electrode, which are supported with a substrate.

The movable electrode is movable in a direction parallel to the substrate. The movable electrode faces the fixed electrode so that a detection distance therebetween is formed. When a physical quantity is applied to the sensor, the movable electrode is displaced so that the detection distance is changed. The change of the detection distance is measured by an electric circuit so that the physical quantity is detected.

In the above physical quantity sensor, it is required to detect a displacement error of the movable electrode. Therefore, an additional construction is necessitated to detect the displacement error. For example, the substrate extends in a horizontal direction of the substrate to form a surface electrode for applying an electric potential between the substrate and the movable electrode. This electric potential generated between the substrate and the movable electrode provides an electro static force therebetween so that the displacement error is detected. Accordingly, the dimensions of the sensor chip become larger. Further, it is required that the surface electrode is connected to the circuit chip with a bonding wire. Thus, the dimensions of the physical quantity sensor become larger, and the manufacturing process of the sensor becomes complicated.

SUMMARY OF THE INVENTION

In view of the above-described problem, it is an object of the present invention to provide a physical quantity sensor having a sensor chip and a circuit chip. The sensor can detect a displacement error of a movable portion of the sensor chip without increasing the dimensions of the sensor.

A physical quantity sensor includes: a circuit chip; and a sensor chip disposed on the circuit chip through an adhesive layer. The sensor chip includes: a support substrate; a movable electrode movable in a horizontal direction of the substrate; and a pair of fixed electrodes facing the movable electrode with a detection distance therebetween. The sensor chip is capable of detecting a physical quantity applied to the sensor on the basis of a distance change of the detection distance in accordance with a displacement of the movable electrode. The movable electrode and the fixed electrodes are disposed on the substrate. The adhesive layer includes a non-adhesive region and a conductive member. The non-adhesive region is disposed on a region obtained by projecting the sensor chip to the circuit chip. The conductive member is disposed in the non-adhesive region for electrically connecting between the circuit chip and the substrate.

In the above sensor, the circuit chip and the support substrate of the sensor chip are electrically connected each other with the conductive member disposed in the non-adhesive region. Accordingly, an electric signal outputted from the circuit chip can be transmitted to the substrate through the conductive member without bonding by a wire therebetween. Further, the conductive member can be formed without increasing the dimensions of the sensor chip. Thus, the electric signal can be applied to the substrate without increasing the size of the sensor chip and without forming a bonding wire between the substrate and the circuit chip. Therefore, it is possible to detect a displacement error of the movable electrode in the vertical direction of the substrate without increasing the dimensions of the sensor.

BRIEF DESCRIPTION OF THE DRAWINGS

The above and other objects, features and advantages of the present invention will become more apparent from the following detailed description made with reference to the accompanying drawings. In the drawings:

FIGS. 8A and 8B are plan views showing the adhesive layers according to modifications of the preferred embodiment;

FIG. 9 is a plan view showing a sensor chip of an acceleration sensor according to a comparison of the preferred embodiment;

FIG. 10 is a cross sectional view showing the sensor chip taken along line X-X in FIG. 9.

DETAILED DESCRIPTION OF THE PREFERRED EMBODIMENT

Figure 1:
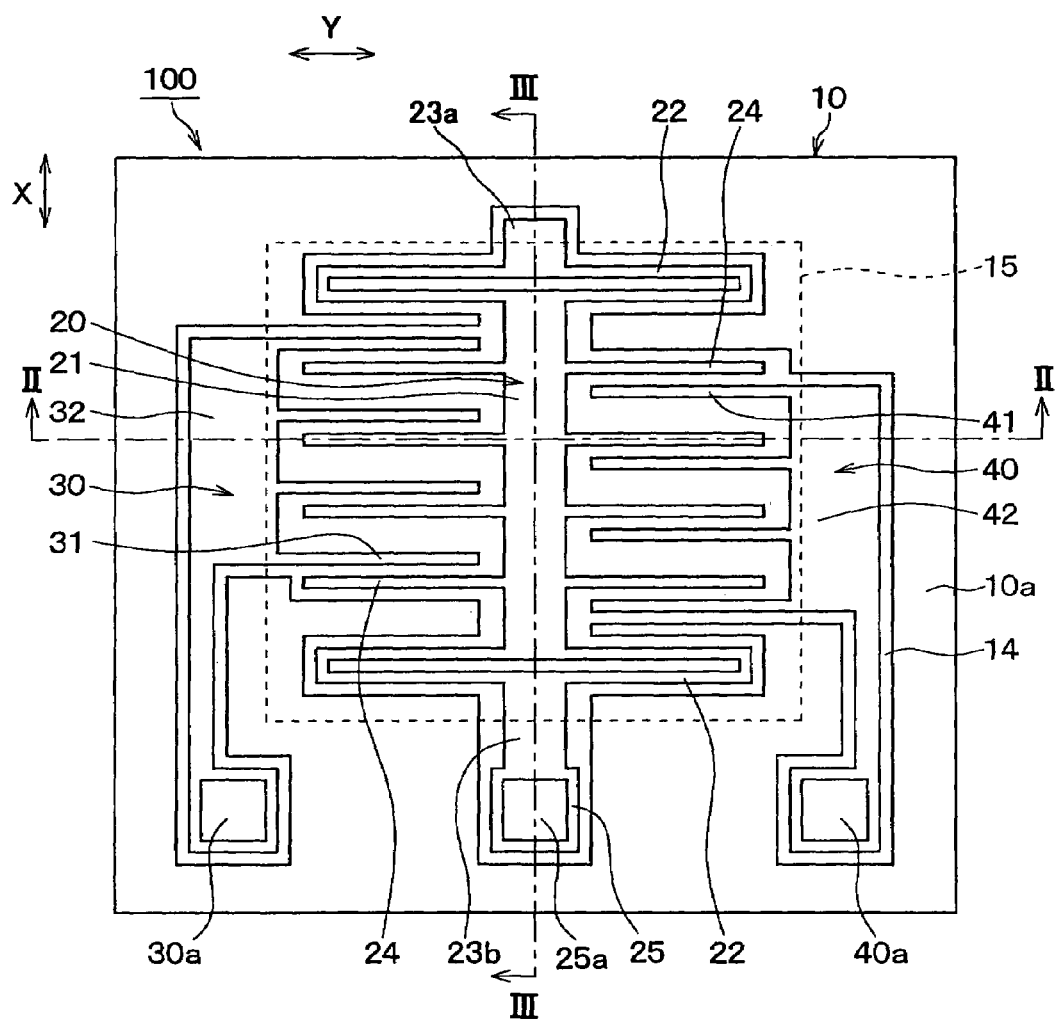
FIG. 1 is a plan view showing a sensor chip of an acceleration sensor according to a preferred embodiment of the present invention.

The inventor has preliminarily studied about a physical quantity sensor as a comparison having a sensor chip J100, which is shown in FIGS. 9 and 10. The sensor chip J100 includes a semiconductor substrate 10 processed by a conventional micro machining method. The substrate 10 is made of silicon on insulator (i.e., SOI) substrate, which has the first silicon layer 11 as the first semiconductor layer for supporting parts of the chip J100 and the second silicon layer 12 as the second semiconductor layer disposed on the first silicon layer 11 through an oxide film 13 as an insulation film. The substrate 10 has a rectangular shape.

The sensor chip J100 further includes a movable portion 20 having a spring 22 and a movable electrode 24 and a fixed portion 30 having a pair of fixed electrodes 31, 41. The movable electrode 24 is integrally formed with the spring 22. The fixed electrodes 31, 41 face the movable electrode 24. The movable portion 20 and the fixed portion 30 are formed in such a manner that the second silicon layer 12 of the substrate 10 is etched to form a trench.

The spring 22 has a characteristic of spring function for displacing the movable portion 20 in a X direction in accordance with the physical quantity applied to the sensor chip J100. The spring 22 extends in a direction perpendicular to the X direction as a displacement direction. Since the movable electrode 24 is integrated with the spring 22 so that the movable electrode 24 is movable together with the spring 22 in the X direction. The movable electrode 24 has multiple comb-teeth, which is perpendicular to the X direction. The comb-teeth are arranged in parallel along with the X direction.

The fixed electrodes 31, 41 are fixed and supported with the first silicon layer 11. Each fixed electrode 31, 41 has multiple comb-teeth, which are arranged to face the corresponding comb-tooth of the movable electrode 24. Specifically, the comb-teeth of the fixed electrode 31, 41 engage the comb-teeth of the movable electrode 24 so that a side of one comb-tooth of the fixed electrode 31, 41 faces a side of one comb-tooth of the movable electrode 24.

The movable electrode 24 and the fixed electrodes 31, 41 are connected to wire portions 25, 32, 42, respectively. Each wire portion 25, 32, 42 has a pad 25a, 30a, 40a for wire bonding. The pad 25a, 30a, 40a is electrically connected to an external circuit (not shown) through a bonding wire W1, W2, W3.

The left side movable electrode 24 and the fixed electrode 31 provide the first capacitor having the first capacitance CS1. The right side movable electrode 24 and the fixed electrode 41 provide the second capacitor having the second capacitance CS2. In the sensor chip J100, when the physical quantity is applied to the chip J100, the first and the second capacitances CS1, CS2 formed between the left side and the right side movable electrodes 24 and the fixed electrodes 31, 41 are changed. The capacitance difference between the first and the second capacitances CS1, CS2, i.e., (CS1-CS2) is measured so that a signal corresponding to the capacitance difference (CS1-CS2) is outputted from the chip J100. The signal is inputted to the circuit chip so that the signal is processed in the circuit chip. Thus, the physical quantity is detected by the sensor.

Figure 11:
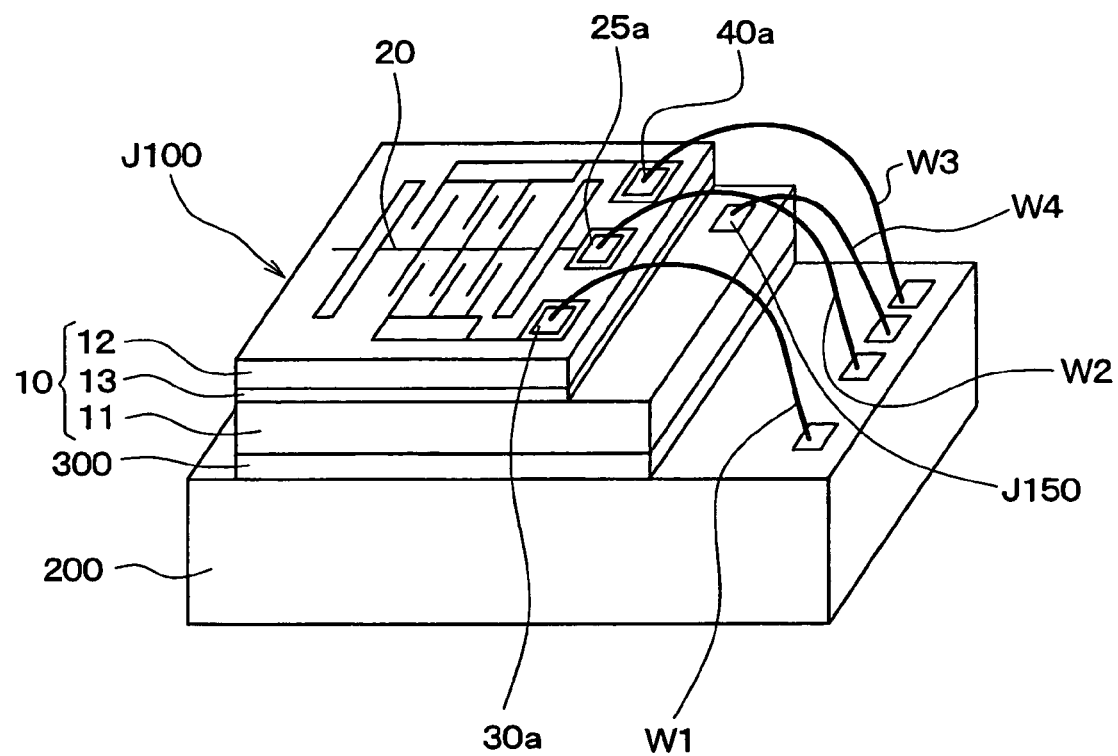
FIG. 11 is a perspective view showing the sensor according to the comparison of the preferred embodiment.

The sensor chip J100 is mounted on the circuit chip 200 so that the physical quantity sensor having the sensor chip J100 and the circuit chip 200 laminated each other is formed. In this case, the lower side of the substrate 11 of the sensor chip J100 is bonded to the circuit chip 200 through an adhesive layer 300 having electrical insulation property. Thus, the stacking type physical quantity sensor is completed, as shown in FIG. 11. Specifically, the sensor chip J100 is mounted on the circuit chip 200 through the adhesive layer 300, which is made of adhesive resin film.

Each pad 25a, 30a, 40a of the sensor chip J100 for wire bonding is electrically connected to the circuit chip 200 through the bonding wire W1, W2, W3. In the stacking structure of the sensor, when the electric potential of the first silicon layer 11 as a support layer is detected or a certain electric potential is applied to the first silicon layer 11, it is necessitated for the first silicon layer 11 to extend in a horizontal direction so that a surface electrode J150 is formed on the upper surface of the first silicon layer 11. Then, the surface electrode J150 and the circuit chip 200 are bonded with the bonding wire W4.

Here, in the sensor chip J100, the reason why the certain electric potential is applied to the first silicon layer 11 is to detect a displacement error of the movable electrode 24. The displacement error is, for example, such that the movable electrode 24 may be displaced in a vertical direction perpendicular to the substrate 10. Specifically, for example, the movable electrode 24 is displaced toward the first silicon layer 11 in a case where the physical quantity is applied to the chip J100 in the vertical direction perpendicular to the substrate 10. In this case, if an extra particle is disposed between the movable electrode 24 and the support substrate 11, the movable electrode 24 may contact the extra particle so that the displacement of the movable electrode 24 may be disturbed by the particle.

Therefore, the sensor chip J100 includes the surface electrode J150 for applying the electric potential to the first silicon layer 11 so that the first silicon layer potential as a support substrate electric potential is provided. By using the surface electrode J150, the electric potential difference is generated between the first silicon layer 11 and the movable electrode 24 so that the electro static attractive force is provided. Thus, the above described detection of the displacement error of the movable electrode 24 is provided by the surface electrode J150.

However, in the above physical quantity sensor shown in FIG. 11, since the first silicon layer 11 extends in the horizontal direction, the dimensions of the sensor chip J100 become larger. Further, it is required that the surface electrode J150 is connected to the circuit chip 200 with the bonding wires W1-W3. Thus, the dimensions of the physical quantity sensor become larger, and the manufacturing process of the sensor becomes complicated.

In view of the above problem, a physical quantity sensor according to a preferred embodiment of the present invention is provided. Specifically, the physical quantity sensor is a differential capacitance type semiconductor acceleration sensor (i.e., a capacitance type acceleration sensor). The sensor is suitably used as a vehicle acceleration sensor or a gyro sensor for controlling and operating an air bag system, ABS (i.e., an anti lock brake system), VSC (i.e., a vehicle stability control) system and the like in an automotive vehicle.

Figure 2:
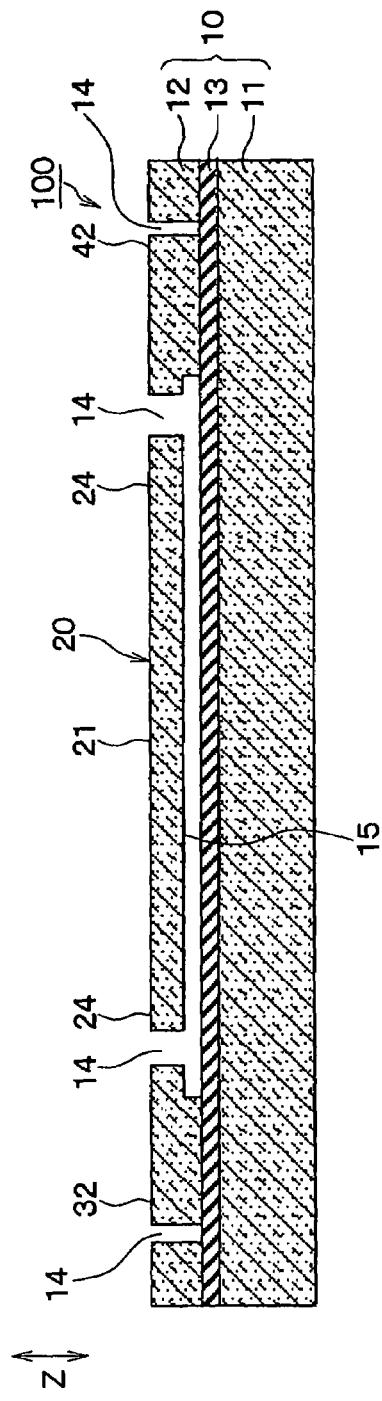
FIG. 2 is a cross sectional view showing the sensor chip taken along line II-II in FIG. 1.
Figure 3:
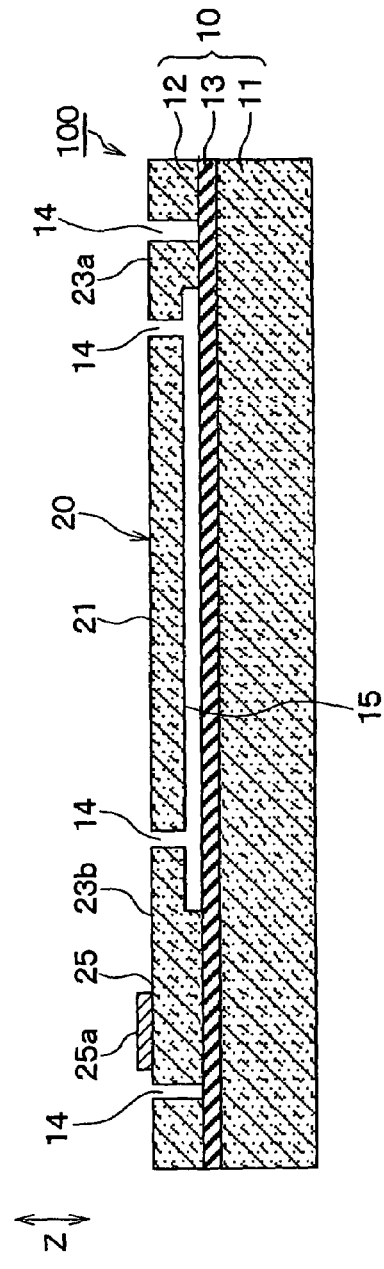
FIG. 3 is a cross sectional view showing the sensor chip taken along line III-III in FIG. 1.
Figure 4:
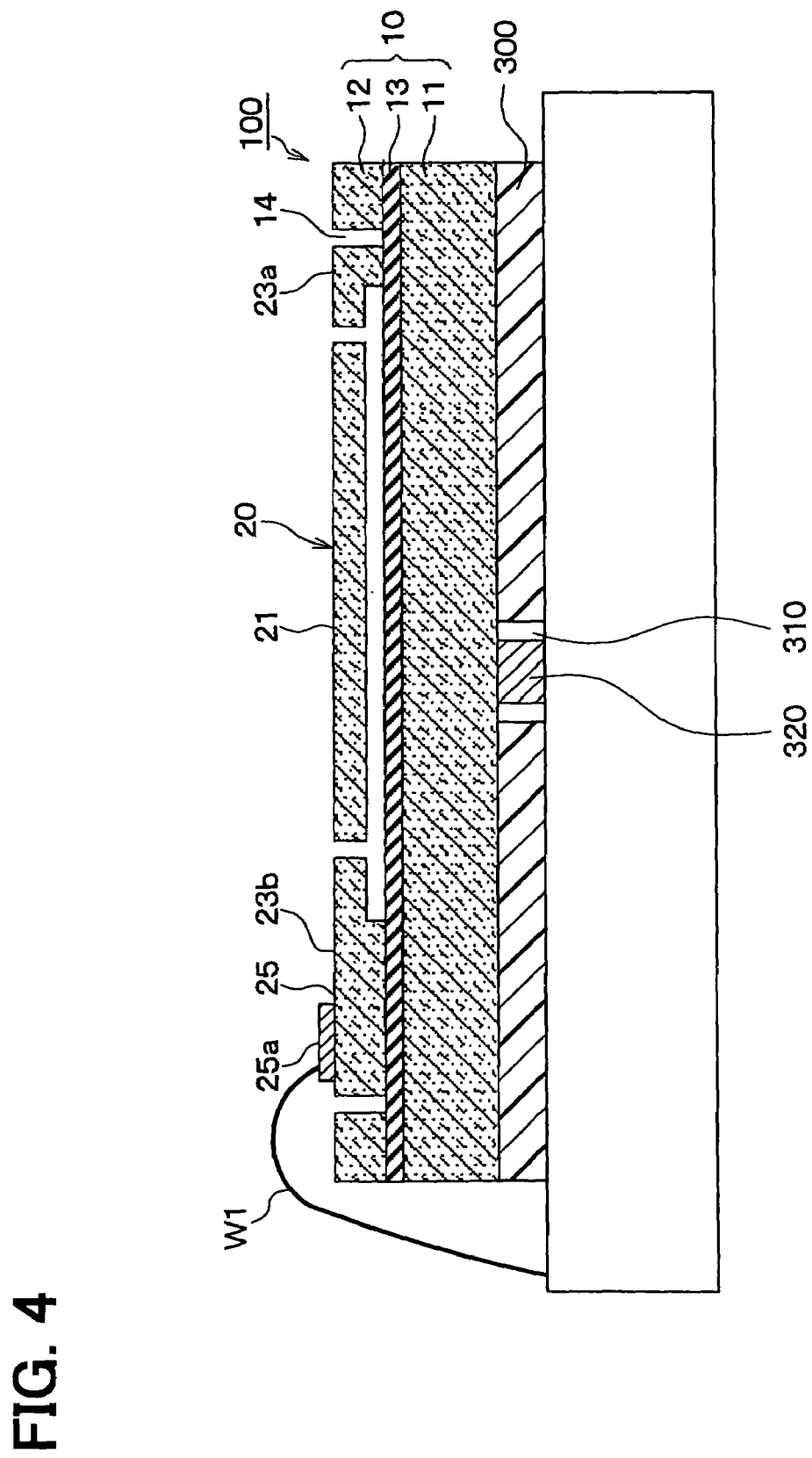
FIG. 4 is a cross sectional view showing the acceleration sensor according to the preferred embodiment.
Figure 5:
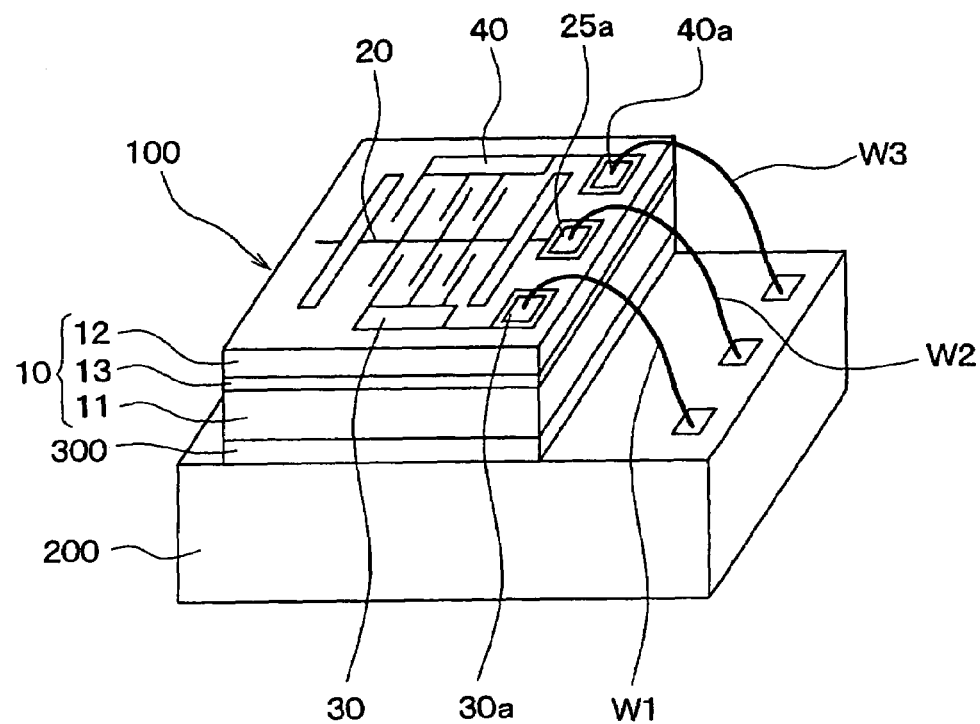
FIG. 5 is a perspective view showing the sensor according to the preferred embodiment.

FIGS. 1 to 3 show a sensor chip 100 of the physical quantity sensor. FIG. 4 shows the sensor chip 100 mounted on a circuit chip 200. FIG. 5 shows the physical quantity sensor.

Firstly, the sensor chip 100 is described. The sensor chip 100 is manufactured by a conventional micro machining method. The sensor chip 100 includes a semiconductor substrate 10. The substrate 10 is made of silicon on insulator (i.e., SOI) substrate, which has the first silicon layer 11 as a support substrate, i.e., the first semiconductor layer for supporting parts of the chip 100 and the second silicon layer 12 as the second semiconductor layer disposed on the first silicon layer 11 through an oxide film 13 as an insulation film. The substrate 10 has a rectangular shape.

The second silicon layer 12 includes a groove 14 so that a movable portion 20 and a pair of fixed portions 30, 40 are formed. The movable portion 20 and a pair of fixed portions 30, 40 having a comb-teeth shape provide a spring construction. The movable portion 20 formed in the second silicon layer 12 and parts of the fixed portions 30, 40, which correspond to a rectangular region 15 shown as a broken line in FIG. 1, become thinner for separating from the oxide film 13. This rectangular region 15 provides a thin portion 15 of the second silicon layer 12.

The sensor chip 100 is manufactured as follows. A mask having a shape corresponding to the spring construction is formed on the second silicon layer 12 of the substrate 10 is by using a photo lithography method. Then, the groove 14 is formed in the second silicon layer 12 by a trench etching method of a dry etching or the like with using a $CF_4$ or $Sf_6$ etching gas. Thus, the spring construction composed of the movable portion 20 and the fixed portions 30, 40 is formed. Specifically, a part of the second silicon layer 12, which is a under portion corresponding to the thin portion 15, is removed by the etching process, i.e., a side etching process. Thus, the sensor chip 100 is completed.

In the sensor chip 100, the movable portion 20 provided by the thin portion 15 is connected to a pair of anchors 23a, 23b through a spring 22. Specifically, the movable portion 20 includes a weight portion 21. The weight portion 21 has a rectangular and slender shape. Both ends of the weight portion 21 connect to the anchors 23a, 23b integrally through the spring 22. The anchors 23a, 23b are fixed on the oxide film 13 so that the anchors 23a, 23b are supported on the first silicon layer 11 as a support substrate through the oxide film 13. Thus, the weight portion 21 and the spring 22 are separated from the oxide film 13 in the Z direction so that they are movable.

As shown in FIG. 1, the spring 22 has a rectangular frame, which is composed of two beams disposed parallel each other and a pair of connections provided by two beams. Specifically, both ends of each beam are bonded together so that the rectangular frame is formed. Thus, the spring can move in a direction (i.e., a X direction in FIG. 1) perpendicular to a longitudinal direction of the beams so that the spring provides a spring function. Therefore, when an acceleration as a physical quantity including a composition parallel to the X direction is applied to the sensor chip 100, the spring portion 22 moves the weight portion 21 in the X direction, which is parallel to the horizontal direction of the substrate 10. Further, when no acceleration is applied to the sensor chip 100, i.e., the accelerated physical quantity is disappeared, the spring portion 22 returns to a predetermined neutral position so that the weight portion 21 is also returned. Thus, the movable portion 20 supported to the semiconductor substrate 10 through the spring 22 is movable in the X direction in accordance with the acceleration applied to the sensor chip 100.

The movable portion 20 includes a movable electrode 24 having a comb-teeth shape. The movable electrode 24 is also provided by the thin portion 15. The movable electrode 24 has multiple comb-teeth extending from both sides of the weight portion 21 toward a Y direction in FIG. 1. Specifically, a left side comb-teeth of the movable electrode 24 extends from the left side of the weight portion 21 toward a certain direction, and a right side comb-teeth of the movable electrode 24 extends from the right side of the weight portion 21 toward another certain direction opposite to the certain direction of the left side comb-teeth. The comb-teeth of the movable electrode 24 are arranged in parallel along with the X direction as an arrangement direction of the comb-teeth, which is a displacement direction of the spring 22 and a longitudinal direction of the weight portion 21.

In this embodiment, the movable electrode 24 includes two sets of four comb-teeth extending from the left and the right sides of the weight portion 21. Each comb-tooth of the movable electrode 24 has a rectangular cross section, and is separated from the oxide film 13. The movable electrode 24, the spring 22 and the weight portion 21 are integrally formed together so that the movable electrode 24 together with the spring 22 and the weight portion 21 is movable and displaceable in the X direction, which is the horizontal direction of the substrate 10.

The fixed portions 30, 40 are fixed to the oxide film 13 on both sides, which are disposed on a periphery of the substrate 10 and are not anchor sides. Thus, the anchors 23a, 23b provide a pair of sides of the substrate 10, and the fixed portions 30, 40 provide another pair of sides of the substrate 10. The fixed portions 30, 40 are supported on the first silicon layer 11 through the oxide insulation film 13.

In FIG. 1, the left side fixed portion 30 disposed on a left side of the weight portion 21 is composed of a left side fixed electrode 31 and a wiring 32 for the left side fixed electrode 31. The right side fixed portion 40 disposed on a right side of the weight portion 21 is composed of a right side fixed electrode 41 and a wiring 42 for the right side fixed electrode 41. Each fixed electrode 31, 41 provided by the thin portion 15 has comb-teeth to engage the comb-teeth of the movable electrode 24, respectively. Thus, the comb-teeth of the fixed electrode 31, 41 face the comb-teeth of the movable electrode 24 with a predetermined distance.

Here, on the left side of the weight portion 21, the comb-teeth of the movable electrode 24 are disposed on lower side of the comb-teeth of the left side fixed electrode 31 so that the comb-teeth of the movable electrode 24 is parallel to that of the left side fixed electrode 31. On the right side of the weight portion 21, the comb-teeth of the movable electrode 24 are disposed on upper side of the comb-teeth of the right side fixed electrode 41 so that the comb-teeth of the movable electrode 24 is parallel to that of the right side fixed electrode 41.

Thus, the movable electrode 24 faces the fixed electrode 31, 41 in the horizontal direction of the substrate 10. The distance between the side of one comb-tooth of the movable electrode 24 and the corresponding side of another comb-tooth of the fixed electrode 31, 41 provides a detection distance for detecting a capacitance between the movable electrode 24 and the fixed electrode 31, 41. Here, the side of the comb-tooth of each of the movable electrode 24 and the fixed electrode 31, 41 is a detection surface.

The left side fixed electrode 31 and the right side fixed electrode 41 are electrically independent each other. Each comb-tooth of the fixed electrodes 31, 41 are parallel to the comb-tooth of the movable electrode 24 substantially, and has a rectangular cross section. The left side fixed electrode 31 and the right side fixed electrode 41 are supported and cantilevered on the wire portions 32, 42, respectively so that the fixed electrode 31, 41 is supported on the substrate 10 through the oxide film 13. Therefore, the fixed electrode 31, 41 is separated from the oxide film 13. Thus, each of the left side and the right side fixed electrodes 31, 41 electrically combined and connected to the common wire portion 32, 42. The left side and the right side fixed electrodes 32, 42 have a left side and a right side pads 30a, 40a for the fixed electrodes 32, 42 disposed on a predetermined position of the fixed electrode 32, 42, respectively.

A wire portion 25 for the movable electrode 24 is integrally formed with the anchor 23b. A pad 25a for the movable electrode 24 is formed on the wire portion 25 at a predetermined position. The pads 25a, 30a, 40a are made of aluminum or the like by a sputtering method or an evaporation method.

As shown in FIGS. 4 and 5, the sensor chip 100 is bonded to the circuit chip 200 through an adhesive layer 300 in such a manner that the lower surface of the first silicon layer 11 faces the upper surface of the circuit chip 200. The adhesive layer 300 has an electric insulation property. The circuit chip 200 includes a detection circuit for processing a signal outputted from the sensor chip 100 and a test circuit for testing the sensor. The circuit chip 200 is, for example, made of semiconductor substrate such as a silicon substrate by using a conventional semiconductor process so that a transistor device such as a MOS transistor device is formed on the circuit chip 200. The pads 25a, 30a, 40a formed on the second silicon layer 12 of the sensor chip 100 are electrically connected to the circuit chip 200 with the bonding wires W1, W2, W3. The bonding wires W1 to W3 are made of gold or aluminum, and bonded therebetween by a wire bonding method.

Figure 6:
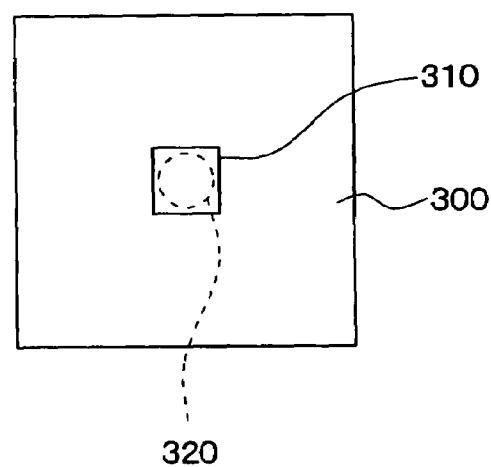
FIG. 6 is a plan view showing an adhesive layer of the sensor according to the preferred embodiment.

The adhesive layer 300 is made of electrically insulation material such as an adhesive film or an adhesive material. For example, the adhesive film is made of poly-imide resin, and the adhesive material is made of epoxy resin or silicone resin. FIG. 6 only shows the adhesive layer 300 in the sensor. The adhesive layer 300 includes a non-adhesive region 310 disposed on a center of the adhesive layer 300. The non-adhesive region 310 is a through hole so that a part of the sensor chip 100 disposed on the non-adhesive region 310 is not bonded to the circuit chip 200 with the adhesive layer 300. However, a conductive member 320 is disposed in the non-adhesive region 310 for electrically connecting between the circuit chip 200 and the sensor chip 100. Specifically, the first silicon layer 11 of the sensor chip 100 electrically connects to the circuit chip 200 with the conductive member 320. The conductive member 320 is made of, for example, a bump, a solder, or a conductive adhesive material. Thus, in the sensor, an electric potential energized from the circuit chip 200 is applied to the first silicon layer 11 of the sensor chip 100 through the conductive member 300.

Thus, in the sensor, the movable electrode 24 and the fixed electrodes 31, 41 are electrically connected to the circuit chip 200 through the bonding wires W1 to W3. Further, the first silicon layer 11 is electrically connected to the circuit chip 200 through the conductive member 320. This acceleration sensor is assembled as follows. Firstly, the conductive member 320 is mounted on the circuit chip 200. Then, the adhesive layer 300 is formed on the circuit chip 200. After that, the sensor chip 100 is mounted on the circuit chip 200 through the adhesive layer 300. Then, the first silicon layer 11 is bonded to the circuit chip 200 electrically. Thus, the sensor is completed.

Although the adhesive layer 300 can be made of an adhesive film or an adhesive material, it is preferred that the adhesive layer 300 is made of an adhesive film since the sensor characteristics is improved. In a case of the adhesive film, the adhesive layer 300 is merely bonded on the circuit chip 200. In a case of the adhesive material, the adhesive material is applied on the circuit chip 200, and then, the sensor chip 100 is mounted on the adhesive material. After that, the adhesive material is hardened so that the adhesive layer 300 is formed.

Further, in a case of the adhesive film, the adhesive film is preliminarily cut so that the non-adhesive region 310 as a through hole is formed in the adhesive film. In a case of the adhesive material, the adhesive material is selectively applied on the circuit chip 200 with using a mask having an opening not corresponding to the non-adhesive region 310.

Next, a detection operation of the acceleration sensor is described as follows. The acceleration applied to the sensor is detected on the basis of the capacitance change between the movable electrode 24 and the fixed electrodes 31, 41. Specifically, the movable electrode 24 has the detection surface of a comb-tooth, which faces the detection surface of a comb-tooth of the fixed electrode 31, 41 so that the detection distance between two detection surfaces is obtained. The detection distance provides for detecting a capacitance between the movable electrode 24 and the fixed electrode 31, 41. The first capacitor having the first capacitance CS1 is formed between the left side fixed electrode 31 and the movable electrode 24, and the second capacitor having the second capacitance CS2 is formed between the right side fixed electrode 41 and the movable electrode 24.

When the acceleration having a component in the X direction is applied to the sensor, the movable portion 20 except for the anchor 23a, 23b is displaced integrally in the X direction in accordance with the spring function of the spring 22 so that the first and the second capacitances CS1, CS2 are changed in accordance with the displacement of the movable electrode 24. For example, when the movable portion 20 moves downwardly in the X direction, the detection distance between the left side fixed electrode 31 and the movable electrode 24 becomes wider. On the other hand, the detection distance between the right side fixed electrode 41 and the movable electrode 24 becomes narrower. Therefore, the capacitance difference between the first and the second capacitances CS1, CS2 defined as (CS1-CS2) is changed. This differential capacitance change is measured so that the acceleration in the X direction is detected.

Specifically, an electric signal on the basis of the capacitance difference is outputted from the sensor chip 100, and then, the signal is inputted into the circuit chip 200 so that the signal is processed in the circuit chip 200. Thus, an acceleration signal is outputted from the circuit chip 200.

Figure 7:
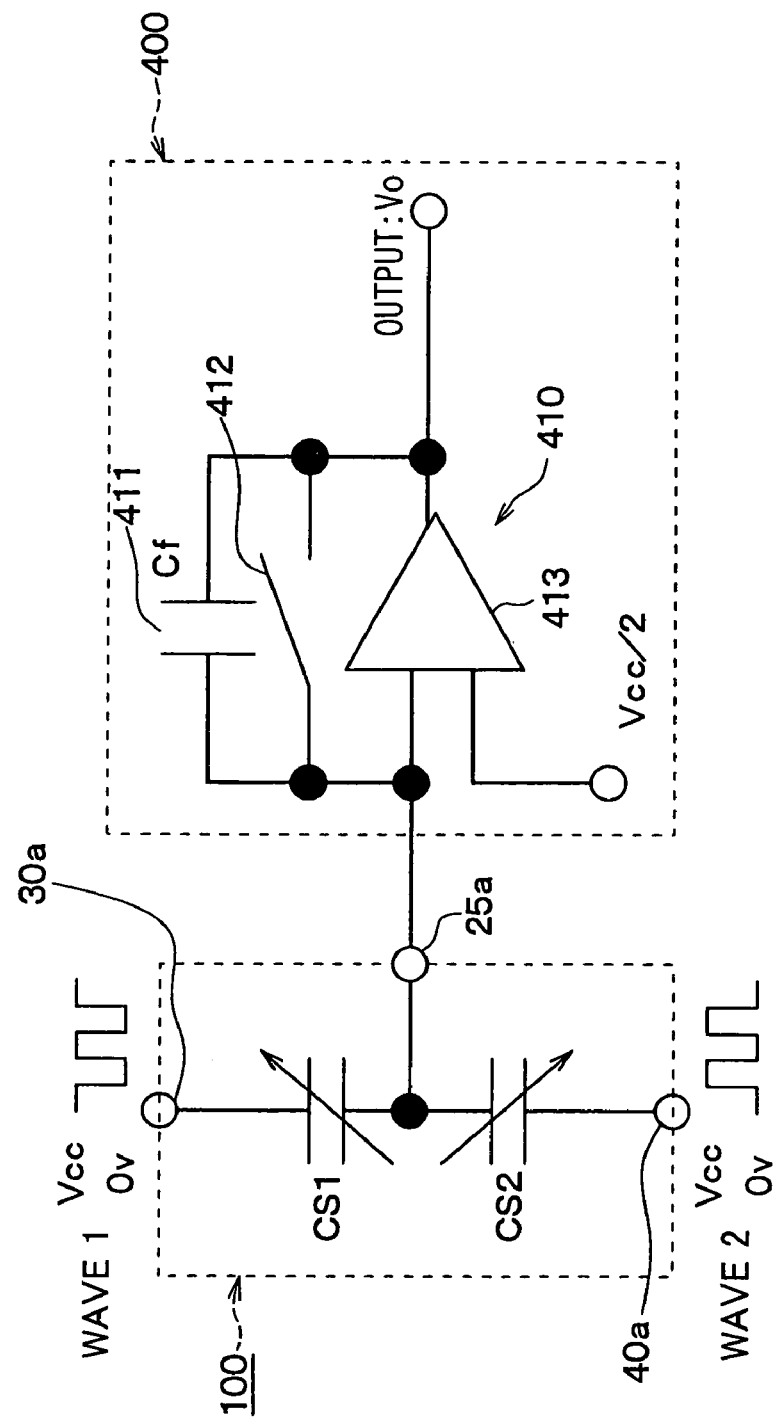
FIG. 7 is a circuit diagram showing an electric circuit of the sensor according to the preferred embodiment.

FIG. 7 shows a detection circuit 400 for detecting the acceleration applied to the sensor chip 100. The detection circuit 400 includes a switched capacitor circuit (i.e., SC circuit) 410 having a capacitor 411, a switch 412 and a differential amplifier 413. The capacitor 411 has a capacitance Cf. The SC circuit 410 converts the inputted capacitance difference of (CS1-CS2) to a voltage. In the sensor, the first carrier wave 1 having an amplitude of Vcc is inputted from the left side fixed electrode pad 30a, and the second carrier wave 2 having the amplitude of Vcc is inputted from the right side fixed electrode pad 40a. The second carrier wave 2 has the same amplitude as the first carrier wave 1, and an opposite phase opposite to the first carrier wave 1. Specifically, the phase of the second carrier wave 2 is shifted by 180 degree from that of the first carrier wave 1. Thus, the switch 412 of the SC circuit 410 is opened and closed by a predetermined timing in accordance with the first and the second carrier waves 1, 2.

The applied acceleration in the X direction is outputted as a voltage Vo, which is defined as Formula 1.

$$Vo = (CS1-CS2) \times Vcc \div Cf \tag{F1}$$

Thus, the acceleration is detected.

According to the preferred embodiment, the acceleration sensor includes the sensor chip 100. The sensor chip has the first silicon layer 11 as the support substrate, the movable electrode 24 movable in the horizontal direction of the substrate 10, and the fixed electrodes 31, 41 facing the movable electrode 24 with the detection distance therebetween. When the acceleration is applied to the sensor, the movable electrode 24 is displaced so that the detection distance between the movable electrode 24 and the fixed electrode 31, 41 is changed. Thus, the applied acceleration is detected on the basis of the distance change of the detection distance.

The sensor chip is bonded to the circuit chip 200 through the adhesive layer 300 having the electrically insulation property. The adhesive layer 300 includes the non-adhesive region 310, which is disposed under the sensor chip 100 and provided by the through hole. In the non-adhesive region 310, the conductive member 320 is disposed for connecting between the circuit chip 200 and the first silicon layer 11 of the sensor chip 100. Thus, the circuit chip 200 and the first silicon layer 11 of the sensor chip 100 are electrically connected each other.

Thus, the electric signal outputted from the circuit chip 200 is transmitted to the first silicon layer 11 through the conductive member 320 without bonding by a wire therebetween so that the certain electric potential is applied to the first silicon layer 11.

Further, the conductive member 320 is disposed under the sensor chip 100. Specifically, the conductive member 320 is disposed in the non-adhesive region 310 of the adhesive layer 300, which is disposed in a region obtained by projecting the sensor chip 100 to the circuit chip 200. Therefore, the conductive member 320 can be formed without increasing the dimensions (i.e., the size) of the sensor chip 100.

Accordingly, in the sensor, the electric potential can be applied to the first silicon layer 11 of the sensor chip 100 without increasing the size of the sensor chip 100 and without forming a bonding wire between the first silicon layer 11 and the circuit chip 200. Here, the electric potential applied to the first silicon layer 11 of the sensor chip 100 is controlled by the circuit chip 200. Therefore, the electro static force is generated by the potential difference between the first silicon layer 11 and the movable electrode 24 in accordance with the applied electric potential. This electro static force can be used for detecting the displacement error of the movable electrode 24 in the vertical direction Z of the substrate 10, as shown in FIGS. 2 and 3.

Further, although the adhesive layer 300 has the non-adhesive region 310 as the through hole disposed on the center of the adhesive layer 300, the non-adhesive region 310 can be formed on a periphery of the adhesive layer 300. Although the non-adhesive region 310 has a cylindrical shape, the non-adhesive region 310 can have a square pole shape or the like. Further, the conductive member 320 can be provided by a bump. In this case, the dimensions of the bump can be the same as a conventional bump formed by a conventional semiconductor process. Further, the dimensions of the non-adhesive region 310 can be formed as small as possible as long as the conductive member 320 is accommodated in the non-adhesive region 310. Therefore, the adhesive layer 300 has sufficient area of bonding between the sensor chip 100 and the circuit chip 200 so that a sufficient bonding strength is secured.

(Modifications)

FIGS. 8A and 8B show other non-adhesive regions 311, 312 according to modifications of the preferred embodiment. The non-adhesive region 311 shown in FIG. 8A is a concavity as a notch formed in the adhesive layer 300. The non-adhesive region 312 shown in FIG. 8B is a slit dividing the adhesive layer 300. Further, the planar area of the adhesive layer 300 is set to be smaller than that of the sensor chip 100 so that the outside of the adhesive layer 300 provides the non-adhesive region 310. Thus, the conductive member 320 can be formed on the outside of the adhesive layer 300. Accordingly, the conductive member 320 is disposed on the outer periphery of the sensor chip 100.

Although the movable electrode 24 and the fixed electrodes 31, 41 have comb-teeth shapes, respectively, they can have other shapes. Further, although the movable electrode 24 and the fixed electrodes 31, 41 are made of semiconductor, they can be made of other materials.

Although the sensor is the capacitance type acceleration sensor, the sensor can be an angular rate sensor or another physical quantity sensor.

Such changes and modifications are to be understood as being within the scope of the present invention as defined by the appended claims.

What is claimed is:

1. A physical quantity sensor comprising:
    a circuit chip; and
    a sensor chip disposed on the circuit chip through an adhesive layer, wherein the sensor chip includes:
       a support substrate;
       a movable electrode movable in a horizontal direction of the substrate; and
       a pair of fixed electrodes facing the movable electrode with a detection distance therebetween,
    the sensor chip is capable of detecting a physical quantity applied to the sensor on the basis of a distance change of the detection distance in accordance with a displacement of the movable electrode,
    the movable electrode and the fixed electrodes are disposed in the substrate,
    the adhesive layer includes a non-adhesive region and a conductive member,
    the non-adhesive region is disposed on a region obtained by projecting the sensor chip to the circuit chip,
    the conductive member is disposed in the non-adhesive region for electrically connecting between the circuit chip and the substrate, and
    the non-adhesive region is disposed on a region obtained by projecting the movable portion in the sensor chip to the circuit chip.

2. The sensor according to claim 1, wherein the circuit chip is capable of applying an electric potential to the substrate through the conductive member for testing a displacement error of the movable electrode.

3. The sensor according to claim 1, wherein the non-adhesive region is a through hole in the adhesive layer.

4. The sensor according to claim 1, wherein the non-adhesive region is a notch in the adhesive layer.

5. The sensor according to claim 1, wherein the non-adhesive region is a slit in the adhesive layer.

6. The sensor according to claim 1, wherein the conductive member is a bump.

7. The sensor according to claim 1, wherein the conductive member is made of solder.

8. The sensor according to claim 1, wherein the conductive member is made of conductive adhesive material.

9. The sensor according to claim 1, wherein the non-adhesive region is disposed at a center of the adhesive layer.

10. The sensor according to claim 1, wherein the support substrate includes first and second semiconductor layers,
    the first semiconductor layer is bonded to the circuit chip through the adhesive layer, and
    the movable electrode and the fixed electrodes are disposed in the second semiconductor layer.

* * * * *